United States Patent
Yoshino et al.

(10) Patent No.: US 10,101,398 B2
(45) Date of Patent: Oct. 16, 2018

(54) CELL MONITORING DEVICE, METHOD, AND COMPUTER PROGRAM PRODUCT

(71) Applicant: Kabushiki Kaisha Toshiba, Minato-ku (JP)

(72) Inventors: Koichi Yoshino, Fuchu (JP); Ryo Okabe, Hino (JP); Norihiro Kaneko, Kunitachi (JP); Takehiro Usumori, Fuchu (JP); Kazuto Kuroda, Arakawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 256 days.

(21) Appl. No.: 15/012,953

(22) Filed: Feb. 2, 2016

(65) Prior Publication Data

US 2016/0223616 A1 Aug. 4, 2016

(30) Foreign Application Priority Data

Feb. 3, 2015 (JP) .................................. 2015-019670

(51) Int. Cl.
  *G01N 27/416* (2006.01)
  *G01R 31/36* (2006.01)
  (Continued)

(52) U.S. Cl.
  CPC ..... *G01R 31/3606* (2013.01); *G01R 31/3648* (2013.01); *G06F 1/24* (2013.01);
  (Continued)

(58) Field of Classification Search
  CPC ... G01R 31/3606; G01R 31/3648; G06F 1/24; G06F 11/30; H02J 7/0021
  See application file for complete search history.

(56) References Cited

U.S. PATENT DOCUMENTS

| 6,274,950 B1 | 8/2001 | Gottlieb et al. |
| 2001/0045780 A1 | 11/2001 | Gottlieb et al. |

(Continued)

FOREIGN PATENT DOCUMENTS

| CA | 2 878 222 A1 | 2/2014 |
| JP | 11-3486 A | 1/1999 |

OTHER PUBLICATIONS

Milan Verle, PIC Microcontrollers—Programming in C, section 3.12 Reset! Black-Out, Brown-Out or Noises?, MikroElektronika, 2009.*

(Continued)

*Primary Examiner* — Daniel Miller
(74) *Attorney, Agent, or Firm* — Oblon, McClelland, Maier & Neustadt, L.L.P.

(57) ABSTRACT

According to one embodiment, a cell monitoring device that performs monitoring of a cell module under control of a battery management device (BMD), includes a communication controller and a control device. The communication controller is capable of being connected to BMD through a communication line. The control device performs an activation processing of the communication controller at a time of initialization, and controls the cell monitoring device. The control device performs a reboot processing of the communication controller in a period shorter than a period of detecting an error condition of the communication controller by BMD when a second voltage drops to be below an operation allowable voltage of the communication controller in a state in which a first voltage is above a certain operation allowable voltage. The first voltage represents a power supply voltage of the control device. The second voltage represents a power supply voltage of the communication controller.

9 Claims, 8 Drawing Sheets (51) Int. Cl.
  *H02J 7/00* (2006.01)
  *G06F 1/24* (2006.01)
  *G06F 11/30* (2006.01)
  *H02J 9/00* (2006.01)

(52) U.S. Cl.
  CPC ............ *G06F 11/30* (2013.01); *H02J 7/0021* (2013.01); *H02J 9/00* (2013.01)

(56) References Cited

U.S. PATENT DOCUMENTS

| | | |
|---|---|---|
| 2004/0189097 A1 | 9/2004 | Gottlieb et al. |
| 2005/0162129 A1 | 7/2005 | Mutabdzija et al. |
| 2005/0184593 A1 | 8/2005 | Gottlieb et al. |
| 2007/0200434 A1 | 8/2007 | Gottlieb et al. |
| 2008/0278006 A1 | 11/2008 | Gottlieb et al. |
| 2010/0049457 A1 | 2/2010 | Mutabdzija et al. |
| 2011/0077881 A1* | 3/2011 | Matsumura ....... H01M 10/4207 702/63 |
| 2013/0320768 A1* | 12/2013 | Fujimatsu ................ H02J 1/00 307/77 |
| 2015/0008931 A1 | 1/2015 | Sugeno et al. |
| 2015/0286198 A1 | 10/2015 | Sugeno et al. |

OTHER PUBLICATIONS

Jurgilewicz, Power Supply Sequencing Made Simple—Design Note 401, 2006, available at http://cds.linear.com/docs/en/design-note/dn401f.pdf.*

Extended European Search Report dated Jun. 28, 2016 in Patent Application No. 16153255.1.

* cited by examiner

FIG.8

CELL MONITORING DEVICE, METHOD, AND COMPUTER PROGRAM PRODUCT

CROSS-REFERENCE TO RELATED APPLICATIONS

This application is based upon and claims the benefit of priority from Japanese Patent Application No. 2015-019670, filed Feb. 3, 2015, the entire contents which are incorporated herein by reference.

FIELD

Embodiments described herein relate generally to a cell monitoring device, a method, and a computer program product.

BACKGROUND

In recent years, as technology of storage battery progresses, such as a lithium ion secondary battery, use of storage batteries to a large-scale power-storage system is considered. Taking lithium ion secondary batteries as an example, the power storage capacity of a single cell is on the order of approximately 100 watt hours (Wh). Therefore, to implement a storage battery device of the order of megawatt hour, it is necessary to arrange cells of the order of several thousands to tens of thousands in serial or parallel, and to configure the storage device that has a desired voltage and current capacity.

In such a case, a technique of making a number of sets of battery modules that are constituted in a unit of several tens of voltages (V) and several tens of amperes (A), and of monitoring a state of all battery modules by centralized control with a battery management unit (BMU) has been generally adopted.

In communication between the BMU and a battery module, for example, communication (transmission and reception) in accordance with the controller area network (CAN) standards is performed. In a large-capacity storage-battery system, the number of battery modules is large, and therefore, a communication line, namely, a transmission distance, becomes long.

For this reason, while a battery control system can be configured at a lower voltage because it can be operated by low power, a communication system is required to be operated by high power, thereby requiring a higher voltage. Accordingly, two power supply systems are necessary.

In the large-capacity storage-battery system configured as above, when a power supply voltage temporarily becomes low, there can be a case that the communication system is in an inoperable state while the battery control system is operable depending on the voltage.

In such a case, to secure reliability, resetting and rebooting the battery control system and the communication system of the storage battery system when the power supply voltage recovers has conventionally been practiced.

Accordingly, a malfunction that the storage battery system temporarily stops can occur.

The present invention has been achieved in view of the above problem, and provides a cell monitoring device, a method, and a computer program product that enable to recover a communication system certainly, avoiding a stop of an entire storage battery system.

DETAILED DESCRIPTION

In general, according to one embodiment, a cell monitoring device that performs monitoring of a cell module under control of a battery management device, comprises a communication controller and a control device. The communication controller is capable of being connected to the battery management device through a communication line. The control device performs an activation processing of the communication controller at a time of initialization, and controls the cell monitoring device.

The control device performs reboot processing of the communication controller in a period shorter than a period of detecting an error condition of the communication controller by the battery management device when a second voltage drops to be below an operation allowable voltage of the communication controller in a state in which a first voltage is above a certain operation allowable voltage. The first voltage represents a power supply voltage of the control device. The second voltage represents a power supply voltage of the communication controller.

Next, a storage battery device of the embodiment is explained in detail, referring to the drawings.

Figure 1:
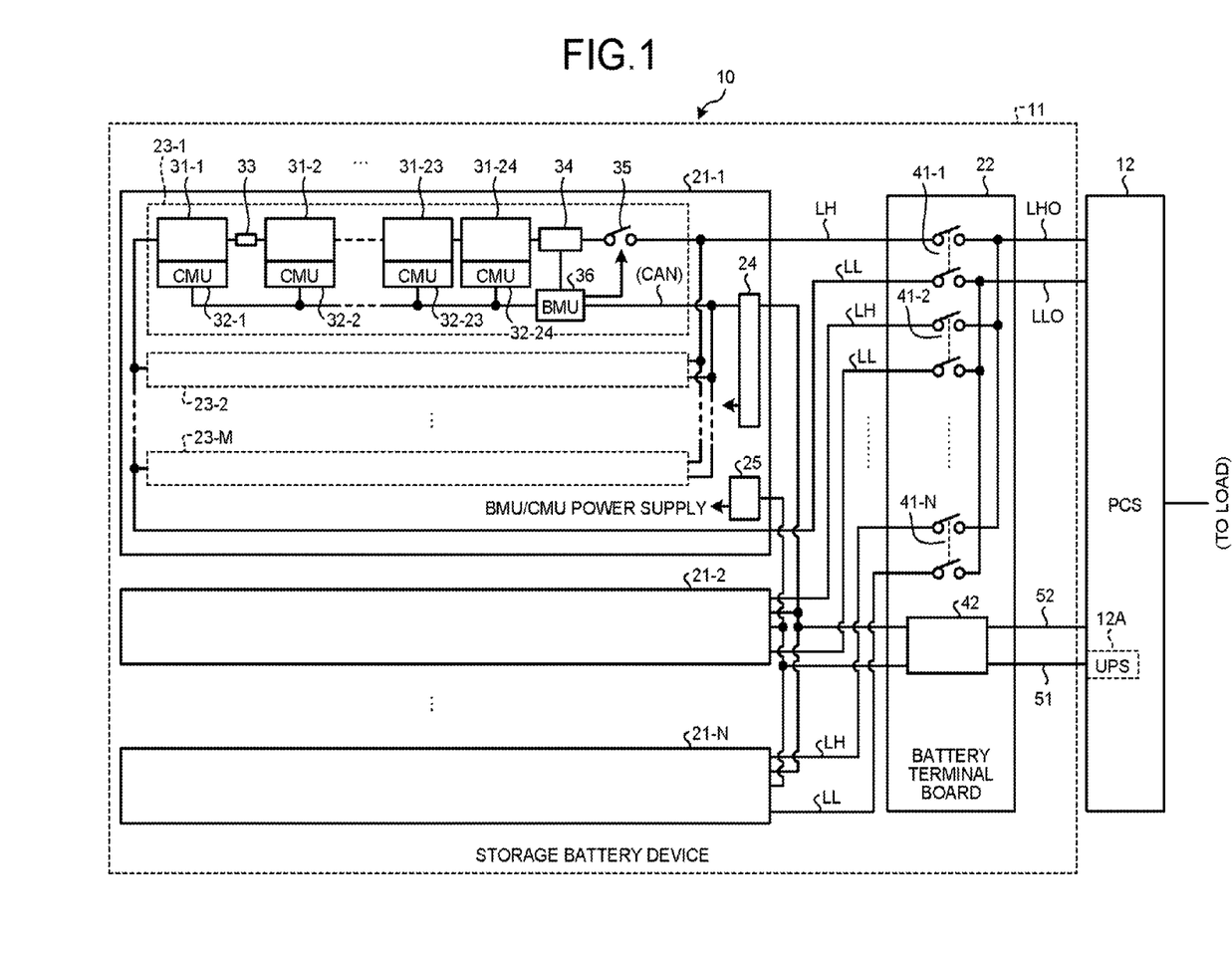
FIG. 1 is a block diagram illustrating one example of a schematic configuration of a storage battery system that includes a storage battery device according to an embodiment.

FIG. 1 is a block diagram illustrating a schematic configuration of a storage battery system that includes the storage battery device in the embodiment.

A storage battery system 10 includes a storage battery device 11 and a power conditioning system (PCS) 12, in rough division. The storage battery device 11 accumulates power. The PCS 12 converts a direct-current power supplied from the storage battery device 11 into an alternate-current power having a desired power quality, to supply to a load.

The storage battery device 11 includes a Plurality of battery boards 21-1 to 21-N (N is a positive integer), and a battery terminal board 22 to which the battery boards 21-1 to 21-N are connected.

The battery boards 21-1 to 21-N include a plurality of battery units 23-1 to 23-M (M is a positive integer) that are connected in parallel to each other, a gateway device 24, a direct-current power-supply unit 5 that supplies direct-current power source for operation to the BMU and the CPU described later.

A configuration of the battery unit is explained.

Each of the battery units 23-1 to 23-M is connected output power-source lines (buses) LHO and LLO through a high-potential power-supply line LH and a low-potential power-supply line LL, to supply power to the PCS 12 being a main circuit.

The battery units 23-1 to 23-M each have the same configuration, and therefore, the battery unit 23-1 is explained as an example.

The battery unit 23-1 includes a plurality of cell modules 31-1 to 31-24 (24 units in FIG. 1), a plurality of CMUs 32-1 to 32-24 (24 units in FIG. 1) that are respectively provided in the cell modules 31-1 to 31-24, a service disconnect 33, an electric current sensor 34, and a contactor 35, in rough division, and the cell modules 31-1 to 31-24, the service disconnect 33, the electric current sensor 34, and the contactor 35 are connected in series.

In the cell modules 31-1 to 31-24, battery cells are connected in series to form a battery pack. Furthermore, a plurality of sets of the cell modules 31-1 to 31-24 connected in series form a battery pack group.

Moreover, the battery unit 23-1 includes a BMU 36, and a communication line of each of the CMUs 32-1 to 32-24 and an output line of the electric current sensor 34 are connected to the BMU 36.

The BMU 36 controls the entire battery unit 23-1 under control of the gateway device 24, and performs opening and closing control of the contactor 35 based on a communication result (voltage data and temperature data described later) of each of the CMUs 32-1 to 32-24 and a detection result of the electric current sensor 34.

Next, a configuration of the battery terminal board 22 is explained.

The battery terminal board 22 includes a plurality of board shielding devices 41-1 to 41-N that are arranged corresponding to the battery boards 21-1 to 21-N, and a master device 42 that configured as a microcomputer that controls the entire storage battery device 11.

To the master device 42, a control power-source line 51 that is provided through a uninterruptible power system (UPS) 12A of the PCS 12 between the master device 42 and the PCS 12, and a control communication line 52 that is configured as the Ethernet (registered trademark) and that communicates control data are connected.

Figure 2:
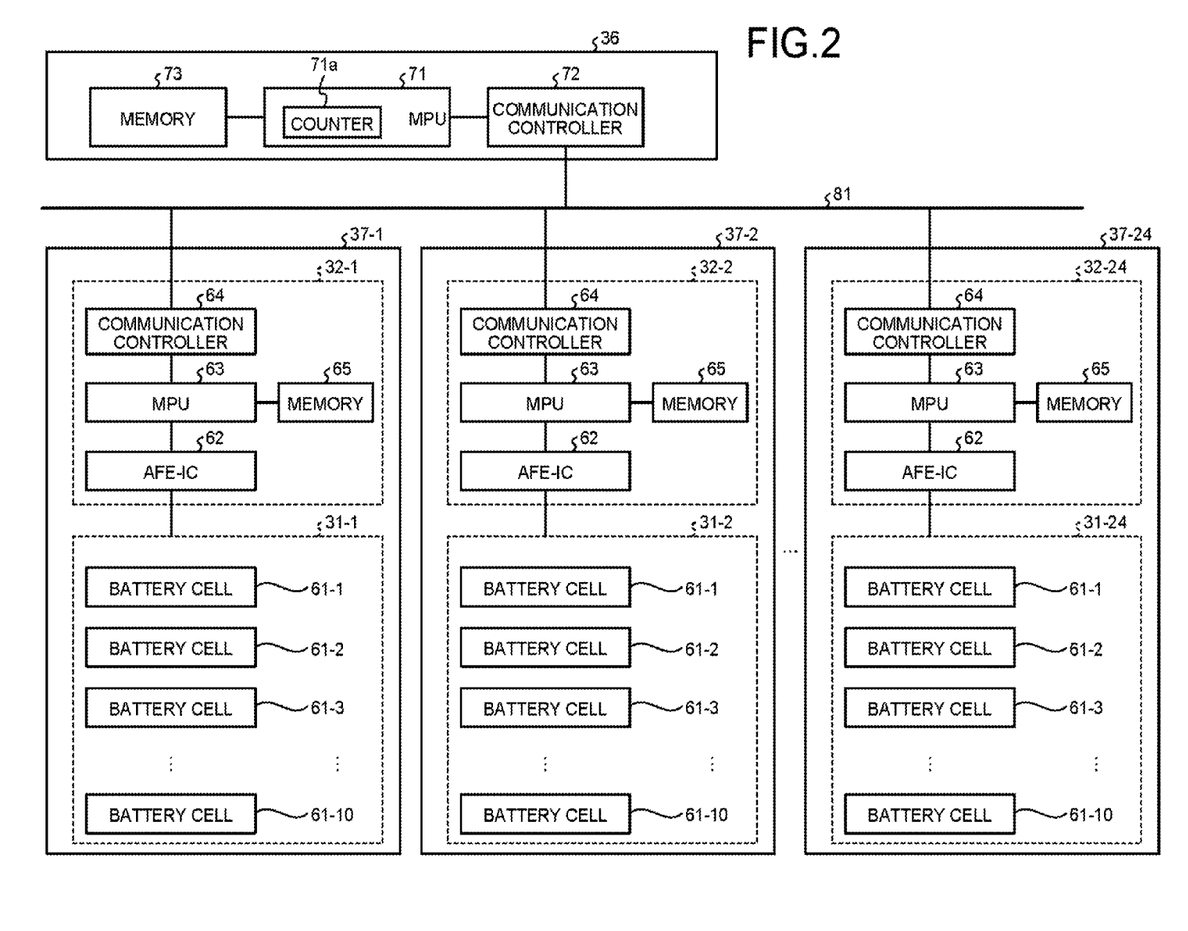
FIG. 2 is an explanatory diagram illustrating one example of a schematic configuration of a cell module, a cell monitoring unit (CMU), and a BMU in the embodiment.

Detailed configurations of the cell modules 31-1 to 31-24, the CMUs 32-1 to 32-24, and the BMU 36 are explained.

FIG. 2 is an explanatory diagram illustrating schematic configurations of the BMU, the cell module, and the CMU.

The BMU 36 includes a microprocessing unit (MPU) 71, a communication controller 72, and a memory 73. The MPU 71 controls the entire BMU 36. The MPU 71 includes a counter 71*a*. The counter 71*a* is to count the number of times when measurement data fails to be received at the time when a certain transmission period Tc has elapsed since a start point of time of previous reception of measurement data from a communication controller 64 of the CMUs 32-1 to 32-24. The communication controller 72 is a controller to perform a CAN communication with the CMUs 32-1 to 32-24, and conforms to the CAN standards. The memory 73 stores voltage data and temperature data that are transmitted from the CMUs 32-1 to 32-24.

Each of the cell modules 31-1 to 31-24 includes a plurality of battery cells 61-1 to 61-10 (10 in FIG. 2) that are connected in series.

In the following explanation, structures in which the cell modules 31-1 to 31-24 and the corresponding CMUs 32-1 to 32-24 are respectively combined are referred to as battery modules 37-1 to 37-24. For example, a structure in which the cell module 31-1 and the corresponding CMU 32-1 are combined is referred to as the battery module 37-1.

The CMUs 32-1 to 32-24 include a voltage-temperature measuring integrated-circuit (IC) (analog front end IC: AFE-IC) 62, an MPU 63, the communication controller 64, and a memory 65. The voltage-temperature measuring IC 62 measures a voltage and temperature of a certain position of the battery cells 61-1 to 61-10 included in the cell modules 31-1 to 31-24 corresponding to the CMUs 32-1 to 32-24. The MPU 63 performs overall control of a corresponding one of the CMUs 32-1 to 32-24. The communication controller 64 is a controller to perform the CAN communication with the BMU 36, and conforms to the CAN standards. The memory 65 is to store voltage data corresponding to a voltage per cell and temperature data in a nonvolate manner, and is configured as an electrically erasable and programmable read-only memory (EEPROM) or the like.

The MPU 63 functions as a battery control system and the communication controller 64 functions as a communication system that is operated by power supply at a voltage higher than a voltage of power supplied to the battery control system.

Figure 3:
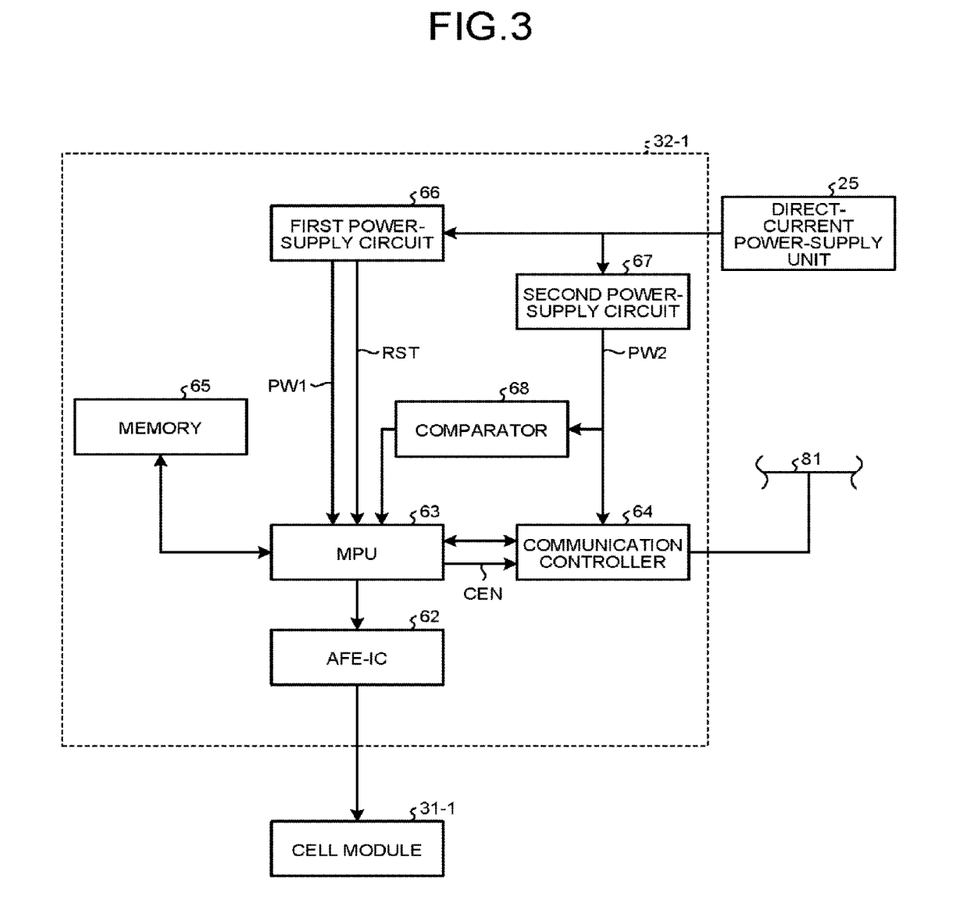
FIG. 3 is a block diagram illustrating one example of a detailed configuration of the CMU in the embodiment.

FIG. 3 is a block diagram illustrating a detailed configuration of the CMU.

The CMUs 32-1 to 32-24 each have the same configuration, and therefore, a detailed configuration is explained taking the CMU 32-1 as an example.

The CMU 32-1 includes, as illustrated in FIG. 3, a first power-supply circuit 66, a second power-supply circuit 67, and a comparator 68 in addition to the voltage-temperature measuring IC 62, the MPU 63, the communication controller 64, and the memory 65 described above. The first power-supply circuit 66 performs power conversion of power supplied by the direct-current power-supply unit 25 to supply a first power PW1 that is an operating power of the MPU 63 having a first voltage V1 to the MPU 63, and outputs a reset signal RST to the MPU 63 when the voltage of power supplied by the direct-current power-supply unit 25 temporarily drops to lower the voltage of the first power PW1.

The second power-supply circuit 67 performs power conversion of power supplied by the direct-current power-supply unit 25 to supply a second power PW2 that is an operating power of the communication controller 64 having a second voltage V2 (>V1) to the communication controller 64. The comparator 68 outputs a low-voltage detection signal LOV to the MPU 63 when the voltage of the second power PW2 drop to be below a permissible minimum voltage of the communication controller 64.

In the above configuration, when the low-voltage detection signal LOV is input, the MPU 63 outputs a CN transceiver enable signal CEN for rebooting the communication controller 64 to the communication controller 64.

In the above configuration, the first power-supply circuit 66 is configured, for example, as a direct-current (DC)/DC converter, and the first voltage V1 is, for example, 3.3 volts (V). Moreover, the second power-supply circuit 67 is configured, for example, as a low drop-out regulator (LDO), and the second voltage V2 is, for example, 5 V.

Furthermore, the voltage of power supplied by the direct-current power-supply unit 25 is, for example, 12 V.

Next, operation of the embodiment is explained.

Figure 4:
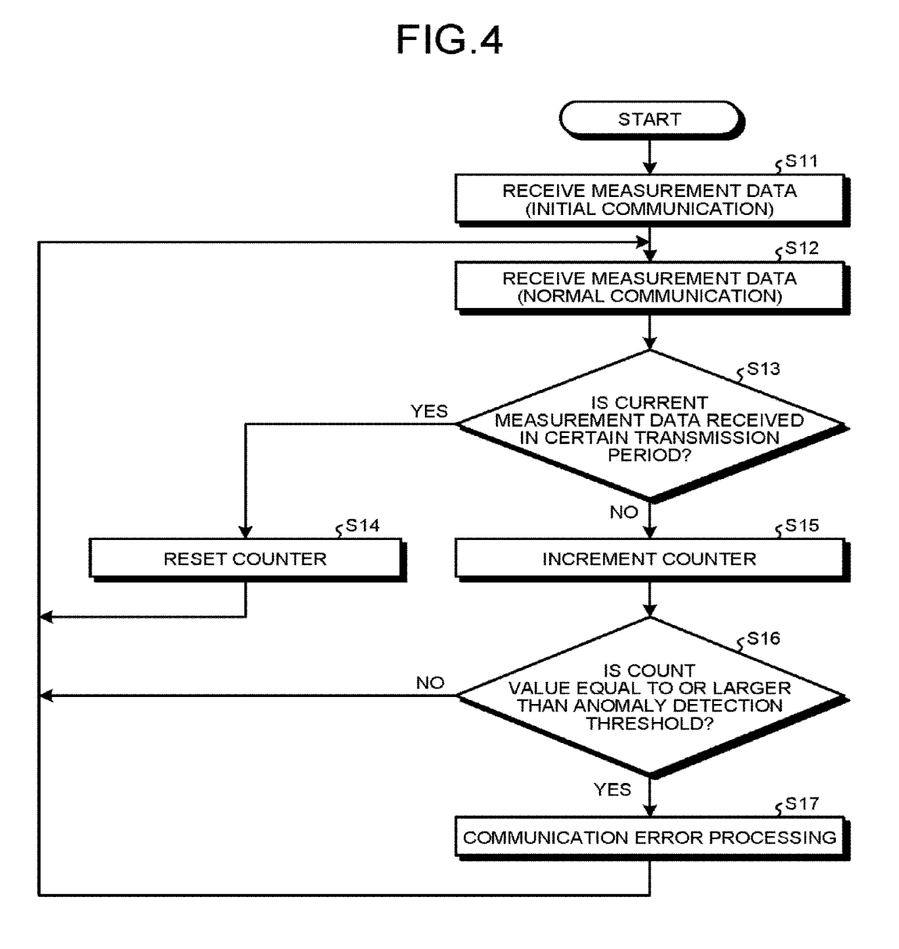
FIG. 4 is a flowchart illustrating one example of processing performed by the BMU in the embodiment.

FIG. 4 is a flowchart of processing of the BMU.

In the following explanation, it is assumed that in an initial state, such as at the time of activation of the BMU 36, all or a part of data of the cell modules 31-1 to 31-24 stored in the memory 73 of the BMU 36 is not taken in (initial state).

First, in the initial state such as at the time of activation, the MPU 71 of the BMU 36 is required to grasp a state of the entire storage battery device 11.

Therefore, the communication controller 72 of the BMU 36 receives all measurement data (voltage data and temperature data) from the communication controller 64 of the CMUs 32-1 to 32-24 (S11).

In this case, since the number of the CMUs 32-1 to 32-24 is large, a communication load is large. Therefore, the communication controller 64 of the CMUs 32-1 to 32-24 decreases (reduces) a sampling period for sampling voltage data and temperature data, which are the measurement data, and a transmission period of transmitting (notifying) data to the BMU 36 compared to a normal operation time, to prevent congestion of data in a communication bus 81 that is the communication line (transmission path).

When a certain time has passed, all of the measurement data of the CMUs 32-1 to 32-24 is to be stored in the memory 73 of the BMU 36.

Thereafter, the communication controller 64 of the CMUs 32-1 to 32-24 is to perform communication periodically, applying a sampling period of sampling of voltage data and temperature data, which are the measurement data, and a transmission period of transmitting (notifying) data to the BMU 36 as a period during normal operation.

Figure 5:
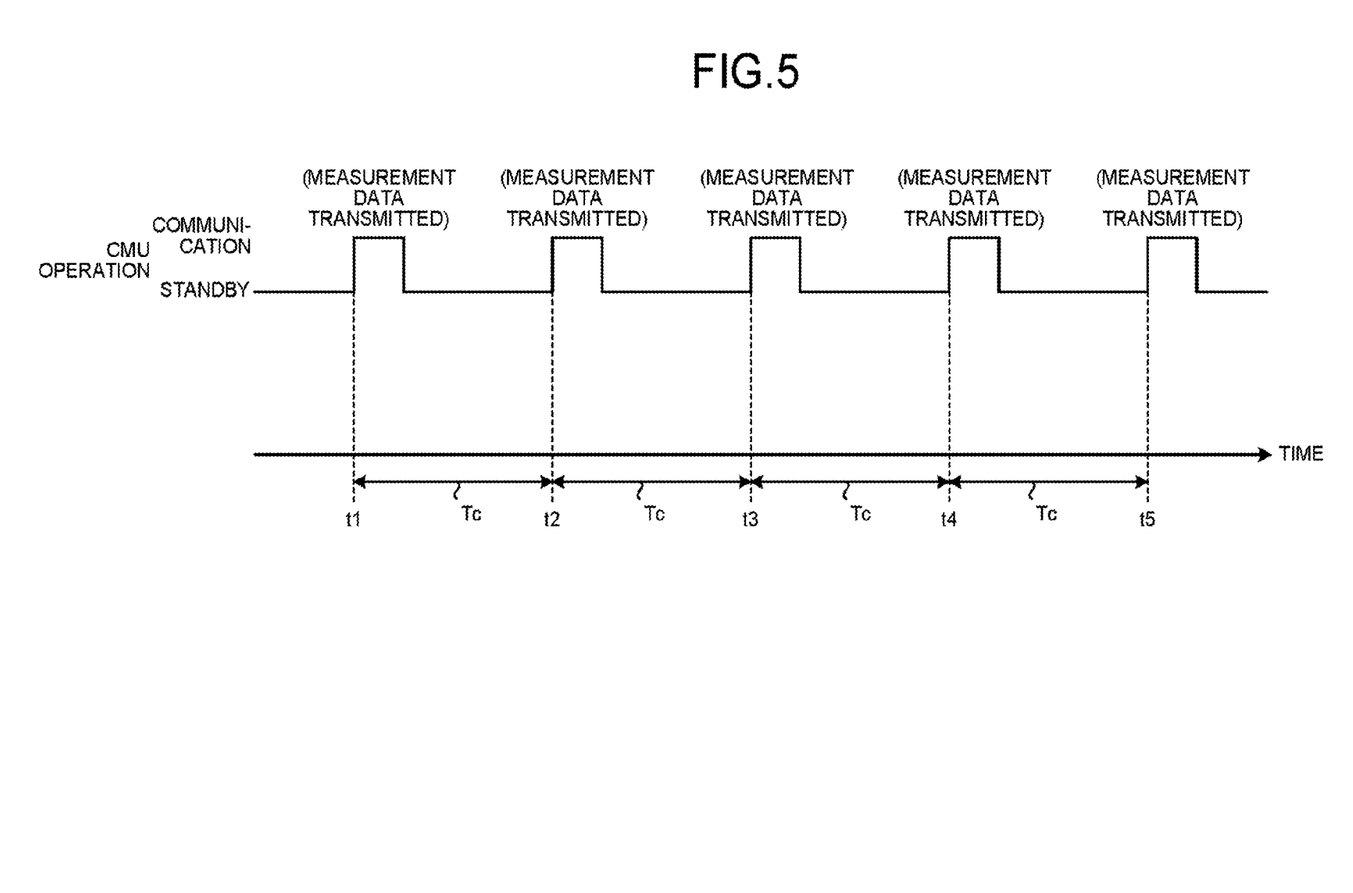
FIG. 5 is an explanatory diagram illustrating one example of a communication state between the CMU and the BMU during normal operation in the embodiment.

FIG. 5 is an explanatory diagram illustrating one example of a communication state between the CMU and the BMU during normal operation.

Explanation is given below taking the CMU 32-1 as an example, supposing that although the transmission period Tc is consistent among the CMUs 32-1 to 32-24, transmission (communication) timing is individually set not to cause congestion of data.

As illustrated in FIG. 5, the communication controller 64 of the CMU 32-1 transmits (notifies) voltage data and temperature data, which are the measurement data, to the BMU 36 in every transmission period Tc (at times t1, t2, t3, . . . ).

At this time, the communication controller 72 the BMU 36 receives the measurement data for each of the CMUs 32-1 to 32-24 as normal communication (S12), and the MPU 71 determines whether the current measurement data is received in the certain transmission period Tc from the time when the previous measurement data was received (S13).

When it is determined at S13 that the communication controller 72 has received the current measurement data when the certain transmission period Tc has passed since the start point of time of reception of the previous measurement data (YES in S13), the MPU 71 resets the counter 71a that counts the number of times when the measurement data fails to be received when the certain transmission period Tc has elapsed since a start point of time of previous reception of the measurement data (S14), and shifts the processing to S12 to be in a standby state effectively.

Figure 6:
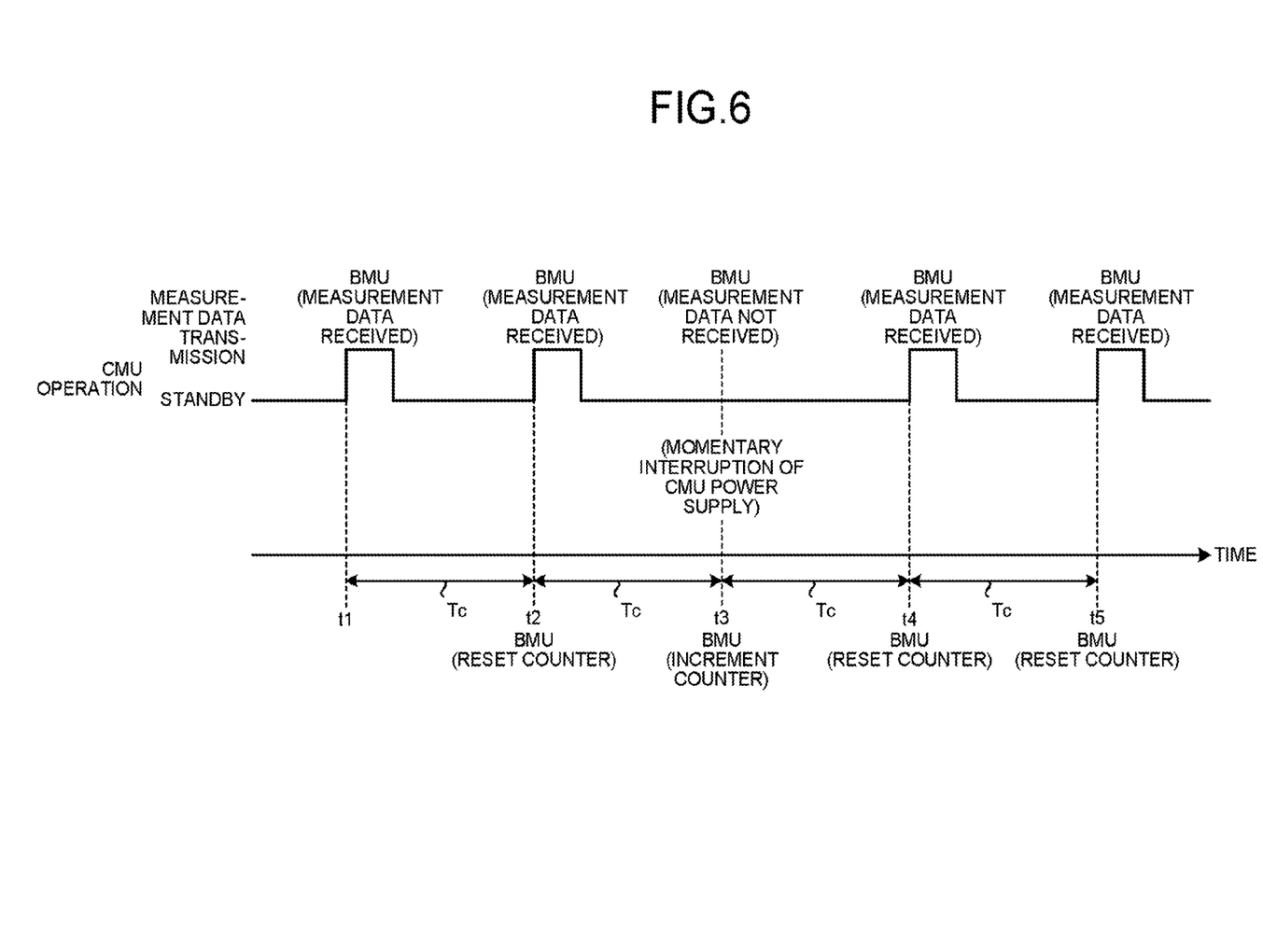
FIG. 6 an explanatory diagram illustrating one example of a communication state between the CMU and the BMU in the event of a momentary interruption of power supply according to the embodiment.

A case in which power supply of the direct-current power-supply unit 25 momentarily stops (hereinafter, a momentary power interruption), and supply voltage for the first power-supply circuit 66 and the second power-supply circuit 67 momentarily drops is explained.

FIG. 6 is an explanatory diagram illustrating one example of a communication state between the CMU and the BMU in the event of a momentary power interruption.

As illustrated in FIG. 6, while at time t1 and time t2, the CMU 32-1 has transmitted voltage data and temperature data, which are the measurement data, to the BMU 36 in every transmission period Tc, at a time corresponding to time t3, the CMU 32-1 has temporarily failed to transmit the measurement data due to the momentary power irruption.

In such a case, it is determined at S13 that the communication controller 72 has failed to receive the measurement data when the certain transmission period Tc has elapsed since a start point of time of previous reception the measurement data (NO in S13), and the MPU 71 increments (+1) the counter 71a that counts the number of times when the measurement data fails to be received when the certain transmission period Tc has elapsed since a start point of time of previous reception of the measurement data (S15). Subsequently, the MPU 71 determines whether a count value of the counter 71a is equal to or larger than a certain anomaly detection threshold (for example, anomaly detection threshold=3) (S16).

However, in the state as illustrated in FIG. 6, it is determined at S16 that the count value of the counter 71a is smaller than the certain anomaly detection threshold (NO in S16), and the processing is shifted again to S12, and the communication controller 72 of the BMU 36 is to be on standby for reception, and thereafter repeats the same processing.

Figure 7:
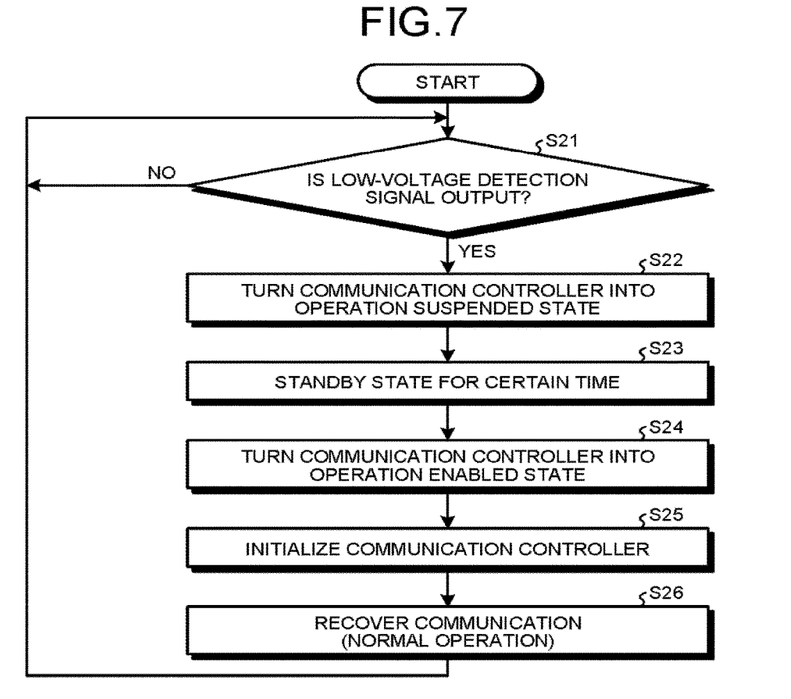
FIG. 7 is a flowchart illustrating one example of processing performed by the CMU in the embodiment.

FIG. 7 is a flowchart of processing performed by the CMU.

Figure 8:
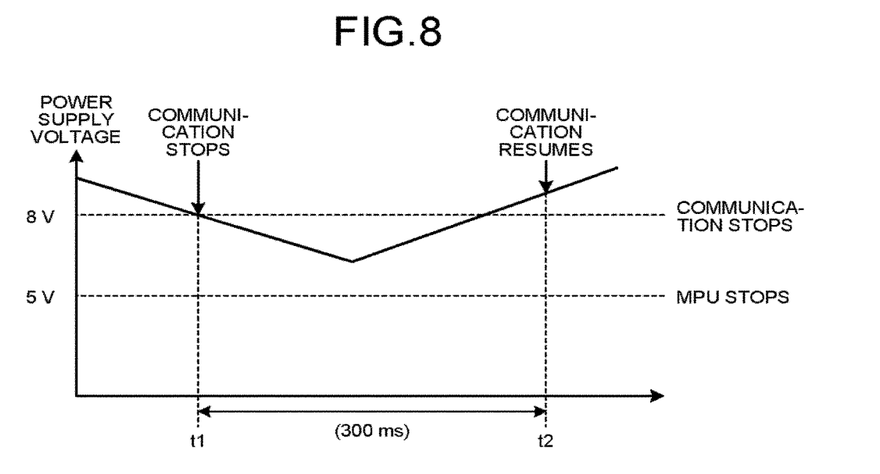
FIG. 8 is an explanatory diagram illustrating one example of operation of the CMU in the event of a momentary interruption of power supply according to the embodiment.

FIG. 8 is an explanatory diagram illustrating operation of the CMU in the event of a momentary power interruption.

A case in which an output voltage of the direct-current power-supply unit 5 drops to be lower than a voltage (for example, lower than 8 V) corresponding to an operation allowable voltage of the communication controller 64 from a normal voltage (for example, 12 V), and is equal to or higher than an operation allowable voltage of the MPU 63 (for example, 5 V and higher) is explained.

In this case, the supply voltage of the second power-supply circuit 67 drops and the communication controller 64 of the CMUs 32-1 to 32-24 stops the CAN communication as indicated at time t1.

On the other hand, when it is within this voltage range (in the above example, the voltage of the direct-current power-supply unit 25 is equal to or higher than 5 V and lower than 8 V), the reset signal RST is not output from the first power-supply circuit 66 to the MPU 63 of the CMUs 32-1 to 32-24, and the low-voltage detection signal LOV indicating that the voltage of the second power PW2 is below the permissible minimum voltage of the communication controller 64 is output, to the MPU 63, from the comparator 68 arranged in a subsequent stage of the second power-supply circuit 67.

Accordingly, the MPU 63 of the CMUs 32-1 to 32-24 determines whether the low-voltage detection signal LOV indicating that the voltage of the second power PW2 is below the permissible minimum voltage of the communication controller 64 is output from the comparator 68 (S21).

When it is determined at S21 that the low-voltage detection signal LOV indicating that the voltage of the second power PW2 is below the permissible minimum voltage of the communication controller 64 has not been output from the comparator 68 (NO in S21), the processing again shifts to S21 to be in a standby state effectively.

When it is determined at S21 that the low-voltage detection signal LOV indicating that the voltage of the second power PW2 is below the permissible minimum voltage of the communication controller 64 is output from the comparator 68 (YES in S21), the MPU 63 brings a CAN-driver power supply into an off state (supply suspended state) by a CAN-transceiver enable signal CEN, and the communication controller 64 into an operation suspended state (S22).

Subsequently, if the momentary power interruption occurs, the MPU 63 is to be in a standby state for a certain time (300 milliseconds (ms) in the present embodiment) that is equal to or longer than a time period that is assumed to allow the output voltage of the direct-current power-supply unit 25 to recover to the normal voltage (S23). In the present embodiment, this certain time is shorter time (period) than time (period) for detecting an error of the communication controller 64 by the BMU 36. When the above certain time is 300 ms, the time (period) for detecting an error of the communication controller 64 by the BMU 36 can be, for example, 900 ms, but is not limited thereto.

Subsequently, at time t2 when a certain standby time has elapsed, the MPU 63 brings the CAN-driver power supply into an on state (supply state) by the CAN-transceiver enable signal CEN, and the communication controller 64 into an operation enabled state (S24).

Subsequently, the MPU 63 outputs an initialization instruction signal to the communication controller 64 through the data communication line, to initialize the communication controller 64 (S25).

As a result, when the output voltage of the direct-current power-supply unit 25 has recovered to the normal voltage, the communication controller 64 turns into a communication recovered state, and performs transmission of the measurement data in every the certain transmission period Tc (S26). The processing shifts again to S21, and the same processing is repeated.

The MPU 71 of the BMU 36 notifies a state of the contactor 35 to the gateway device 24, and the gateway device 24 notifies the number of units of the battery units 23-1 to 23-M included in an activation battery board per an operation state (a normal operation state, a charge requiring state, a suspended state, and the like) thereof, to the master device 42, and the PCS 12 performs power supply to a load.

Figure 9:
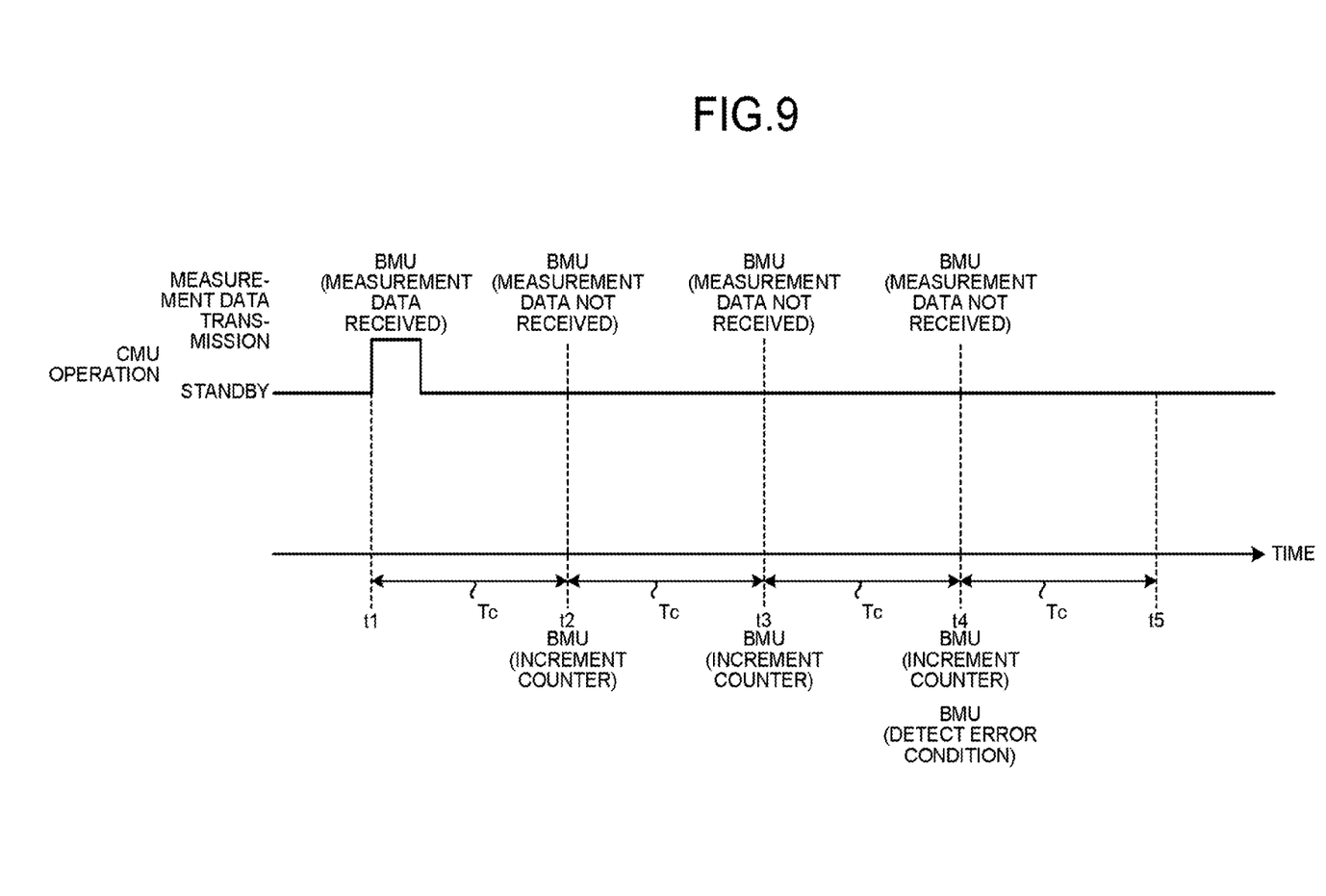
FIG. 9 is an explanatory diagram illustrating an example of a communication state between the CMU and the BMU in an error condition according to the embodiment.

FIG. 9 is an explanatory diagram illustrating one example of a communication state between the CMU and the BMU in an error condition.

As illustrated in FIG. 9, while at time t1, the CMU 32-1 has transmitted voltage data and temperature data, which are the measurement data, to the BMU 36, at time t2 and later, the CMU 32-1 has failed to perform a successive transmission of the measurement data.

In this case, it is determined at S16 in FIG. 4 that the count value of the counter 71a is larger than the certain anomaly detection threshold (YES in S16), the BMU 36 brings the battery unit 23 to which the BMU 36 belongs into a suspended state because of communication error, and the contactor 35 into an open state (off state), and performs a communication error processing to disconnect the concerned battery board from the battery terminal board 22 (S17). The processing shifts again to S12, and the same processing is repeated.

Note that it may be configured to shift to S11 after the processing at S17 is completed, instead of shifting to S12.

The BMU 36 of the concerned battery board notifies the gateway device 24 of disconnection of the concerned battery board, and the gateway device 24 performs response processing such as increasing power supply from another battery board.

As explained above, according to the present embodiment, even when failed transmission of the measurement data that is lower than the anomaly detection threshold due to the momentary power interruption, the MPU 63 of the CMUs 32-1 to 32-24 is not reset, and only the communication controller 64 is reset to be rebooted. Therefore, it is possible to prevent the battery board 21-1 or the entire storage battery device 11 from turning into an operation suspended state.

At this time, because the reboot processing of the communication controller 64 is performed in a period (in the above example, 300 ms) shorter than a period (in the above example, 900 ms) of detecting a communication error of the communication controller 64 by the MPU 71 of the BMU 36, the BMU 36 does not determine as a communication error of the communication controller 64 with a momentary power interruption that happens to be caused and the MPU 63 of the CMUs 32-1 to 32-24 is not to be reset, and therefore, processing in the CMUs 32-1 to 32-24 can be continued.

Furthermore, because at the time of resumption of power supply to the communication controller 64, initialization of the communication controller 64 is performed without failure, unnecessary data (that is, garbage) is not to be transmitted to a communication path (transmission path), and it is possible to prevent a bus-off condition of the communication bus 81 as the communication path.

Although only voltage data and temperature data are explained as the measurement data in the above explanation, another data such as electric current data at a certain position can be included in the measurement data.

The storage battery device of the present embodiment includes a control device such as an MPU, and storage device such as a read only memory (ROM) and a random access memory (RAM), and includes a hardware configuration that uses an ordinary computer.

A control program that is executed by the storage battery device of the present embodiment is recorded in a computer-readable recording medium, such as a compact-disk read-only memory (CD-ROM), a flexible disk (FD), a compact disk recordable (CD-R), a digital versatile disk (DVD), in a file of an installable format or an executable format, to be provided.

Moreover, the control program that is executed in the storage battery device of the present embodiment may be configured to be stored in a computer that is connected to a network such as the Internet, and to be provided by being downloaded through the network. Furthermore, the control program that is executed in the storage battery device of the present embodiment may be configured to be provided or distributed through a network such as the Internet.

Furthermore, the control program of the storage battery device of the present embodiment may be configured to be installed in a ROM or the like to be provided.

Although each of the battery units applies a single-parallel multi-serial unit, a multi-parallel multi-serial unit may be applied. When the battery units are connected in a multi-parallel multi-serial manner, by performing the processing by the respective components, handling two or more single-cells that are connected in parallel as one single cell, the means of solving the problem of the present embodiment can be applied.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A cell monitoring device for monitoring a cell module, comprising:
   a communication controller in communication with a battery management device; and
   a controller for rebooting the communication controller, while a first voltage being a power supply voltage of the controller is above a first operation allowable voltage, when a second voltage being a power supply voltage of the communication controller drops below a second operation allowable voltage and a predetermined time elapses after the drop of the second voltage below the second operation allowable voltage,
   wherein the predetermined time is set within a first time period which is used by the battery management device to detect an error condition of the communication controller, and
   wherein the first voltage is supplied by a first power supply circuit and the second voltage is supplied by a second power supply circuit.

2. The cell monitoring device according to claim 1, wherein, when performing the rebooting, the controller restarts the power supply to the communication controller when the predetermined time elapses and then initializes the communication controller.

3. The cell monitoring device according to claim 1, wherein the predetermined time is longer than a second time period so as not to be affected by a momentary power interruption.

4. The cell monitoring device according to claim 1, wherein the communication controller transmits temperature data and voltage data of the cell module to the cell battery management device.

5. A battery unit comprising:
   a plurality of cell monitoring devices for monitoring cell modules; and
   a battery management device for managing the plurality of cell monitoring devices, wherein each of the cell monitoring devices includes:
      a communication controller in communication with the battery management device, and
      a controller for rebooting the communication controller, while a first voltage being a power supply voltage of the controller is above a first operation allowable voltage, when a second voltage being a power supply voltage of the communication controller drops below a second operation allowable voltage and a predetermined time, which is set within a first time period which is used by the battery management device to detect an error condition of the communication controller, elapses after the drop of the second voltage below the second operation allowable voltage, and
      wherein the first voltage is supplied by a first power supply circuit and the second voltage is supplied by a second power supply circuit.

6. The battery unit according to claim 5, wherein, when performing the rebooting, the controller restarts the power supply to the communication controller when the predetermined time elapses and then initializes the communication controller.

7. The battery unit according to claim 5, wherein the predetermined time is longer than a second time period so as not to be affected by a momentary power interruption.

8. The battery unit according to claim 5, wherein the communication controller transmits temperature data and voltage data of a cell module to a cell monitoring device.

9. A method for monitoring a cell module, comprising:
   communicating with a battery management device using a communication controller,
   rebooting the communication controller with a controller, while a first voltage being a power supply voltage of the controller is above a first operation allowable voltage, when a second voltage being a power supply voltage of the communication controller drops below a second operation allowable voltage and a predetermined time elapses after the drop of the second voltage below the second operation allowable voltage,
   wherein the predetermined time is set within a first time period which is used by a battery management device to detect an error condition of the communication controller, and
   wherein the first voltage is supplied by a first power supply circuit and the second voltage is supplied by a second power supply circuit.

* * * * *